US006174463B1

(12) United States Patent
Machida et al.

(10) Patent No.: US 6,174,463 B1
(45) Date of Patent: Jan. 16, 2001

(54) LAYER CRYSTAL STRUCTURE OXIDE, PRODUCTION METHOD THEREOF AND MEMORY ELEMENT USING THE SAME

(75) Inventors: Akio Machida; Naomi Nagasawa; Takaaki Ami; Masayuki Suzuki, all of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/048,050

(22) Filed: Mar. 26, 1998

(30) Foreign Application Priority Data

Mar. 27, 1997  (JP) ..................................................... 9-076154
Mar. 27, 1997  (JP) ..................................................... 9-076155

(51) Int. Cl.$^7$ .............................. H01B 1/08; G11C 11/22

(52) U.S. Cl. ............................... 252/519.13; 252/520.21; 501/123; 501/126; 365/145

(58) Field of Search ........................... 252/519.1, 519.13, 252/520.21, 521.1; 420/416, 580; 501/123, 126; 365/145, 164

(56) References Cited

U.S. PATENT DOCUMENTS 5,508,226 * 4/1996 Ito et al. ............................... 437/130
5,885,648 * 3/1999 Dougherty et al. ...................... 427/8

FOREIGN PATENT DOCUMENTS 10-338599  12/1998  (JP) .

OTHER PUBLICATIONS

Rentschler "Substitution of Lead Into the Bismuth Oxide Layers . . . " *Materials Research Bull.*, vol. 32, No. 3, pp. 351–369, Mar. 1997.*

Torii et al "Preparation and Dielectric Properties of Nonstoichiometric . . . " *J. Mater. Sci. Lett.*, vol. 17, No. 10, pp. 827–828 (Abstract Only), May 1998.*

Koiwa et al "Effect of Annealing Method to Crystallize . . . " *JJAP,* Part 1, vol. 37, No. 1, pp. 192–197 (Abstract Only), 1998.*

Koiwa et al "Role of Excess Bi in SrBi2Ta2O9 Thin Film . . . " *JJAP,* Part 1, 36(9B) pp. 5904–5907 (Abstract Only), 1997.*

C.A. Paz de Araujo, et al., *Fatigue–free ferroelectric capacitors with platinum electrodes*, Nature, vol. 374, Apr. 13m 1995, pp. 627–629.

K. Amanuma, et al., Preparation and ferroelectric properties of $SrBi_2Ta_2O_9$ thin films, Appl. Phys. lett. 66 (2), Jan. 9, 1995, pp. 221–223.

S. B. Desu, et al., *Novel fatigue–free layered structure ferroelectric thin films*, Master. Sci. and Eng., B32 (1995), pp. 75–81.

G. A. Smolenskii, et al., *Ferroelectrics of the Oxygen–Octahedral Type WIth Layered Structure*, Soviet Phys. Solid State, 3 (1961), pp. 651–655.

(List continued on next page.)

Primary Examiner—Mark Kopec
(74) Attorney, Agent, or Firm—Sonnenschein, Nath & Rosenthal

(57) ABSTRACT

A layer crystal structure oxide, and memory element comprising same, comprising bismuth (Bi), a first element, a second element and oxygen (O), wherein the first element is at least one selected from the group consisting of sodium (Na), potassium (K), calcium (Ca), barium (Ba), strontium (Sr), lead (Pb), and bismuth (Bi), the second element is at least one selected from the group consisting of iron (Fe), titanium (Ti), niobium (Nb), tantalum (Ta), and tungsten (W), and the composition ratio of the bismuth with respect to the second element is larger than the stoichiometric composition ratio, wherein, the composition ratio of the bismuth with respect to the first element is in the range of $(2\pm0.17)/(m-1)$ including the stoichiometric composition ratio $2/(m-1)$, where m is an integer from, and including, 2 to 5.

13 Claims, 13 Drawing Sheets

OTHER PUBLICATIONS

R.E. Newnham, et al., *Structural Basis of Ferroelectricity in the Bismuth Titanate Family*, Mater. Res. Bull. 6 (1971), pp. 1029–1039.

T. Ami, et al., *Preparation and properties of ferroelectric $Bi_2SrTa_2O_9$ thin films for FeRAM using Flash–MOCVD*, Mat. Res. Soc. Symp. Proc. vol. 415, 1996, pp. 195–200.

T. Li, et al., *Metalorganic chemical vapor deposition of ferroelectric $SrBi_2Ta_2O_9$ thin films*, Appl. Phys. Lett.68 (5), Jan. 29, 1996, pp. 616–618.

H. Watanabe, et al., *Preparation of Ferrooelectric Thin Films of Bismuth Layer Structured Compnents*, Japan J. Appl. Phys 34 (1995), pp. 5240–5244.

T. Atsuki, et al., *Preparation of Bi–Based Ferroelectric Thin Films by Sol–Gel Method*, Japan J. Appl. Phys., 34 (1995), pp. 5096–5099.

Y. Ito, et al., *New Low Temperature Processing of Sol–Gel $SrBi_2Ta_2O_9$ Thin Films*, Japan J. Appl. Phys., 35 (1996), pp. 4925–4929.

C.D. Gutleben, et al., *The Microstructure of $SrBi_2Ta_2O_9$ Films*, Mat. Res. Soc. Symp. Proc. vol. 415, (1996), pp. 201–206.

R.E. Newnham, et al., *Crystal Structure of (SR, Ba)$Bi_2Ta_2O_9$*, Mater. Res. Bull. 8 (1973), pp. 1183–1195.

A.D. Rae, et al., *Structure Refinement of Commensurately Modulated Bismuth Strontium Tantalate, $Bi_2r\ Ta_2O_9$*, Acta. Cryst. B48 (1992), pp. 418–428.

* cited by examiner

LAYER CRYSTAL STRUCTURE OXIDE, PRODUCTION METHOD THEREOF AND MEMORY ELEMENT USING THE SAME

BACKGROUND OF THE INVENTION

1. Field of the Invention

The present invention relates to a layer crystal structure oxide called the Aurivillius crystallographic group, a production method of the layer crystal structure, and a memory element using the same.

2. Description of the Related Art

Recently, development is actively conducted on nonvolatile memories comprising a ferroelectric thin film. Accordingly, bismuth strontium tantalate ($Bi_2SrTa_2O_9$; hereinafter referred to as BiSTa) particularly attracts attention as a ferroelectric material comprising nonvolatile random access memories (ferroelectric random access memories: FeRAM) since fatigue caused by the polarization reversal is not present therein (C. A-Paz de Araujo, J. D. Cuchiaro, L. D. McMillan, M. C. Scott and J. F. Scott, Nature, 374 (1995) 627.; K. Amanuma, T. Hase and Y. Miyasaka, Appl. Phys. Lett., 66 (1995) 221.; S. B. Desu and D. P. Vijay, Master. Sci. and Eng., B32 (1995) 75., and the like).

The BiSTa is a so-called Aurivillius crystallographic group, which has been studied by various researchers so far (G. A. Smolenskii, V. A. Isupov and A. I. Agranovskaya, Soviet phys. Solid State, 3 (1961) 651.; E. C. Subbarao, Phys. Rev. 122 (1961) 804.; R. E. Newnham, R. W. Wolfe and J. F. Dorrian, Mater. Res. Bull., 6 (1971) 1029., and the like). The Aurivillius crystallographic group can be represented by a stoichiometric composition of $[Bi_2O_2]^{2+}[Me_{m-1}R_mO_{3m+1}]^{2-}$, wherein m represents an integer of 2 or more, Me represents at least one selected from the group consisting of sodium (Na), potassium (K), calcium (Ca), barium (Ba), strontium (Sr), lead (Pb), and bismuth (Bi), and R represents at least one selected from the group consisting of iron (Fe), niobium (Nb), tantalum (Ta), and tungsten (W).

Recently, a BiSTa thin film production with an MOCVD (metal organic chemical vapor deposition) method for the application in an FeRAM is reported, however, from the result of the X-ray analysis, a good quality film has not been obtained so far (T. Ami, K. Hironaka, C. Isobe, N. Nagel, M. Sugiyama, Y. Ikeda, K. Watanabe, A. Machida, K. Miura and M. Tanaka, Mater. Res. Soc. Symp. Proc., 415 (1996) 195.; T. Li, Y. Zhu, S. B. Desu, C-H. Peng, M. Nagata, Appl. Phys. Lett., 68 (1996) 616.).

For the application of the BiSTa in an FeRAM, the relationship between its composition and the electric characteristics is important. Various kinds of researches have been conducted for clarifying the relationship. For example, concerning polycrystalline BiSTa thin films produced by an MOD (metal organic decomposition) method, it is reported that a thin film with a good ferroelectricity can be obtained with a material composition containing bismuth more than the stoichiometric composition (H. Watanabe, T. Mihara, H. Yoshimori and C. A. Paz de Araujo, Jpn. J. Appl. Phys., 34 (1995) 5240). However, this indicates the relationship between the material composition and the electric characteristic, but not the relationship between the thin film composition and the electric composition. Furthermore, according to the report, the reason why a bismuth amount more than the stoichiometric composition in the material composition is preferable is concluded that finally the stoichiometric composition is obtained owing to the evaporation of the bismuth during the film formation process. Since bismuth is a highly volatile substance, this has been a common conventional view.

It is reported that the EPMA (electron probe microanalysis) of a polycrystalline BiSTa thin film produced by a sol-gel process with a material containing an excessive amount of bismuth and an insufficient amount of strontium with respect to the stoichiometric composition revealed that a composition region indicating the ferroelectivity contains an excessive amount of bismuth and an insufficient amount of strontium with respect to the stoichiometric composition (T. Atuki, N. Soyama, T. Yonezawa and k. Ogi, Jpn. J. Appl. Phys., 34 (1995) 5096; Y. Ito, M. Ushikubo, S. Yokoyama, H. Mtunaga, T. Atuki, T. Yonezawa and K. Ogi, Jpn. J. Appl. Phys., 35 (1996) 4295).

However, according to another research report, the polycrystalline BiSTa thin film accordingly produced contains residual impurities such as a metal bismuth, a bismuth alloy component, and a Bi oxide excluding BiSTa in the grain boundary (C. D. Gutleben, Y. Ikeda, C. Isobe, A. Machida, T. Ami, K. Hironaka and E. Morita, Mat. Res. Symp. Proc, 415 (1996) 201). That is, considering that the range of the measurement region of the EPMA (several $\mu m\phi$ to 50 $\mu m\phi$ beam diameter) remarkably larger than one grain particle size of the polycrystalline BiSTa thin film, it is impossible to analyze the composition in one grain particle of the polycrystalline thin film by the EPMA. Therefore, the above-mentioned analysis result by Atuki et al. contains the bismuth impurities so that it does not show the BiSTa composition ratio.

Another analysis of the composition of the polycrystalline BiSTa thin film by the ICP (inductively coupled plasma) is reported (T. Noguchi, T. Hase and Y. Miyasawa, Jpn. J. Appl. Phys., 35 (1996) 4900). This is also an analysis of the film as a whole containing the metal bismuth present in the grain boundary. That is, there is a certain limitation in grasping the relationship between the BiSTa composition and the electric characteristic by a polycrystalline BiSTa, and thus a research by a single crystal is needed.

However, concerning a single crystal of BiSTa, only very few crystallographic researches are reported including ones conducted by Newnham and Rae are reported (R. E. Newnham, R. W. Wolfe, R. S. Horsey, F. A. Diaz-Colon and M. I. Kay, Mater. Res. Bull., 8 (1973) 1183.; A. D. Rae, J. G. Thompson and R. L. Withers, Acta. Cryst., B48 (1992) 418). Among the two articles, one reported by Newnham deals with a substance prepared by substituting a part of strontium by barium, and thus it is not a pure BiSTa. Beside, the composition ratio of the starting material is not described precisely. In the Rae research, although the starting material has a constant ratio composition, a plate single crystal is obtained only in a two phase mixed state but a single phase synthesis is not achieved therein. Furthermore, the characteristics of the obtained single crystal are hardly analyzed in either research.

As to the other Aurivillius crystallographic group excluding the BiSTa, substantially no research has been conducted on a single crystal but only researches on $Bi_4Ti_3O_{12}$ single crystal by Doriann and Burton are reported (J. F. Dorrian, R. E. Newnham, D. K. Smith and M. I. Kay, Ferroelectrics, 3 (1971) 17.; T. M. Bruton, Ferroelectrics, 7 (1974) 259)).

Therefore, although the Aurivillius crystallographic group represented by the BiSTa attracts attention as a ferroelectric material, the relationship between the composition and the electric characteristic has not been known at all. Therefore, clarification of the relationship between the composition and the electric characteristic has a significant meaning in the application of these layer crystal structure oxide films in an FeRAM, and the like.

As methods for producing single crystals of the Aurivillius crystallographic group, a flux method and a TSSG method (top-seeded solution growth) can be presented. In these method, a flux is added to the material for melting so as to grow a crystal from the liquid phase.

However, in the BiSTa production by the TSSG method by using bismuth oxide ($Bi_2O_3$) as a self flux, since the melting point of the material added with the flux is as high as 1300° C. or more, the bismuth oxide drastically evaporate by heating to the melting point such that the liquid surface cannot be seen, and thus it is difficult to grow a crystal. However, although there is a report on the production of $Bi_3TiNbO_9$. which can be completely melted, among the Aurivillius crystallographic group by the pulling method. However, since a second substance is generated by the bismuth evaporation, and the second substance is taken into the crystal, a good quality crystal cannot be obtained (Daiku Okusakawa, Kenyu Honma, Masanobu Wada, Tohoku University Electric Communication Discussion Group Record, Vol. 3, No 2 (1974) 71). That is, the TSSG method involves a problem in that it is difficult to obtain a good quality crystal due to the bismuth oxide evaporation.

On the other hand, according to the flux method, although the BiSTa can be produced, since the BiSTa has the c face cleavage property, the crystal growth rate is low in the c axis direction, and thus only a thin plate crystal having a 1 to 2 mm square size can be obtained (Japanese Patent Application No. 8-283072). Further, there is a report on the production of $Bi_4Ti_3O_{12}$, which is a incongruent melting compound of the Aurivillius crystallographic group by the flux method. However, again in this case, only a thin plate transparent crystal was obtained due to difficulty in growth in the c axis direction (Hatsuhiko Naito, Koichiro Sakata, Kenyu Honma, Gisaku Ohara, Titanium Barium Study Group Material No. XVI-93-649 (168) 174). That is, the flux method involves a problem in that only a thin plate crystal can be obtained to cause difficulty in handling and putting into actual practice due to the thinness.

SUMMARY OF THE INVENTION

In order to solve the above-mentioned problems, an object of the present invention is to provide a layer crystal structure oxide capable of obtaining a good ferroelectric characteristic, a production method of the layer crystal structure oxide, and a memory element using the same.

A layer crystal structure oxide according to the present invention comprises bismuth, a first element, a second element and oxygen, wherein the first element is at least one selected from the group consisting of sodium, potassium, calcium, barium, strontium, lead and bismuth, the second element is at least one selected from the group consisting of iron, titanium, niobium, tantalum, and tungsten, and the composition ratio of the bismuth with respect to the second element is larger than the stoichiometric composition ratio.

A production method of a crystal structure oxide according to the present invention comprises the steps of evaporating a material by heating to generate a gas phase, precipitating a crystal from the gas phase at a precipitating part so as to produce a layer crystal structure oxide.

A memory element according to the present invention comprises a pair of electrodes connected with a ferroelectric film comprising a layer crystal structure oxide including bismuth, a first element, a second element and oxygen, wherein the first element is at least one selected from the group consisting of sodium, potassium, calcium, barium, strontium, lead and bismuth, the second element is at least one selected from the group consisting of iron, titanium, niobium, tantalum, and tungsten, and the composition ratio of the bismuth with respect to the second element is larger than the stoichiometric composition ratio in the layer crystal structure oxide.

In the layer crystal structure oxide, the composition ratio of the bismuth is larger than the stoichiometric ratio with respect to the second element. Accordingly, the layer crystal structure oxide shows a good ferroelectivity with a low resistance electric field.

In the memory element, when a voltage is applied between the pair of the electrodes, the ferroelectric film is polarized. The voltage-polarization characteristic has a hysteresis, and thus data can be stored or read out utilizing the hysteresis. Herein, since the ferroelectric film comprises a layer crystal structure oxide according to the present invention, the element can function with a low resistance electric field and a low voltage.

DESCRIPTION OF THE PREFERRED EMBODIMENTS

Hereinafter embodiments of the present invention will be explained in detail with reference to the accompanied drawings.

(First Embodiment)

The chemical formula 1 is the composition formula of a layer crystal structure oxide according to the first embodiment:

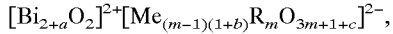
$[Bi_{2+a}O_2]^{2+}[Me_{(m-1)(1+b)}R_mO_{3m+1+c}]^{2-}$, wherein Me represents a first element, R represents a second element, a, b, c represent a difference from the stoichiometric composition (a is larger than 0, b and c are an optional number), m is an integer selected from 2, 3, 4 or 5.

The layer crystal structure oxide comprises bismuth, a first element Me, a second element R and oxygen. The first element Me is at least one selected from the group consisting of sodium, potassium, calcium, barium, strontium, lead and bismuth, and the second element R is at least one selected from the group consisting of iron, titanium, niobium, tantalum, and tungsten. It is preferable that the first element Me is at least one selected from the group consisting of strontium, lead, barium and calcium, and the second element R is at least one selected from the group consisting of niobium, and tantalum. It is particularly preferable that the first element Me is strontium and the second element R is tantalum.

The layer crystal structure oxide does not have a stoichiometric composition, but the composition ratio of the bismuth with respect to the second element R (2+a)/m is larger than the stoichiometric composition ratio (2/m). The stoichiometric composition of the layer crystal structure oxide is $[Bi_2O_2]^{2+}[Me_{m-1}R_mO_{3m+1}]^{2-}$, wherein m represents an integer from 2 to 5. It is preferable that the composition ratio of the bismuth with respect to the first element Me (2+a)/(m−1)(1+b) is in the range of (2±0.17)/(m−1).

For example, when the first element Me is strontium, the second element R is tantalum, and m in the composition formula shown as the chemical formula 1 is 2 (that is, $[Bi_{2+a}O_2]^{2+}[Sr_{1+b}Ta_2O_{7+c}]^{2-}$), it is particularly preferable that the composition ratio of the bismuth with respect to the tantalum (2+a)/2 is larger than 1 but 1.08 or less. It is further preferable that the composition ratio of the bismuth with respect to the strontium (2+a)/(1+b) is 1.88 or more but 2.06 or less.

Figure 1:
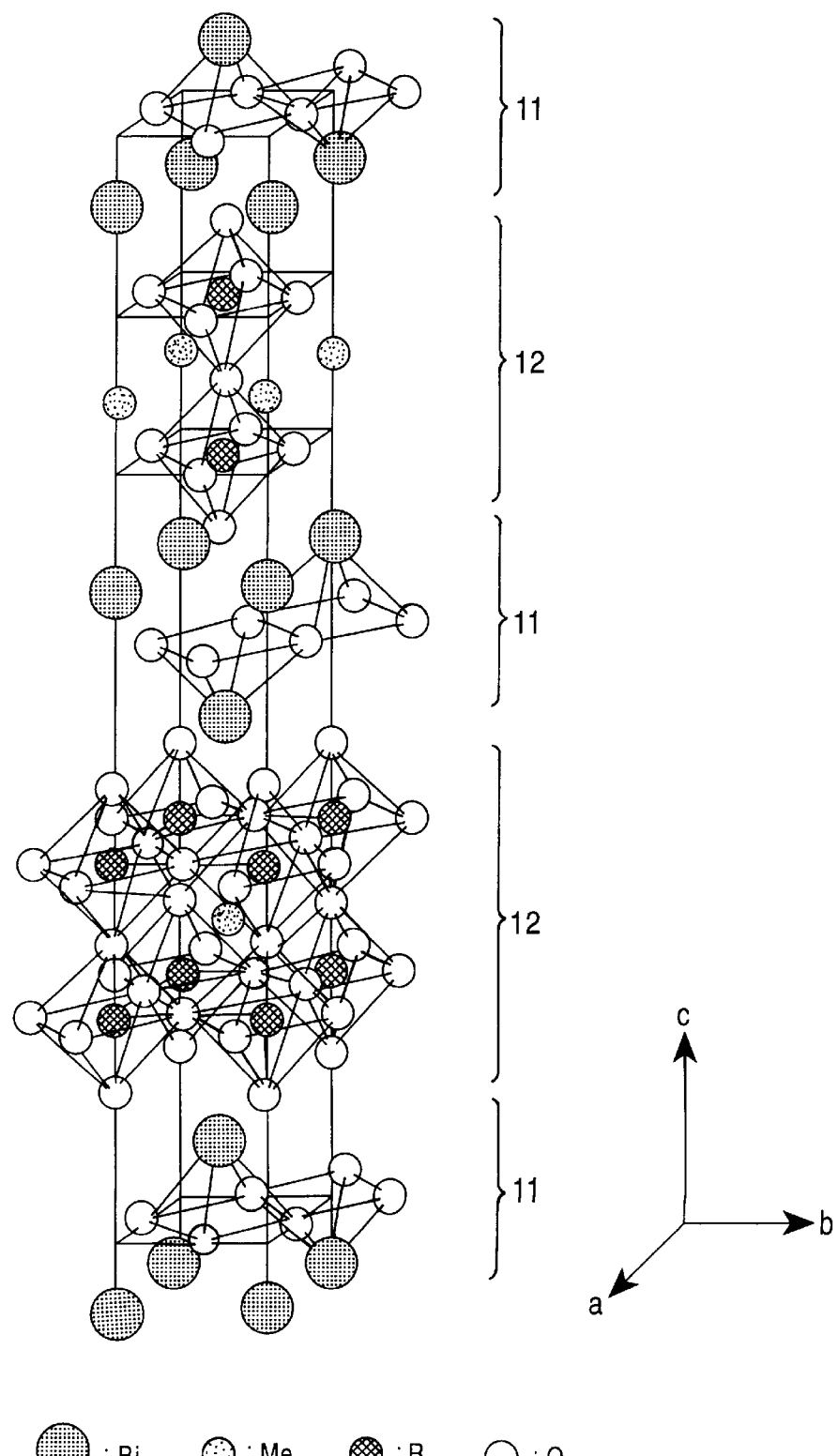
FIG. 1 is a schematic diagram showing the crystal structure of a layer crystal structure oxide according to the first embodiment of the present invention.

FIG. 1 shows the crystal structure of a layer crystal structure oxide shown in the composition formula as the chemical formula 1 where m is 2. Accordingly, the layer crystal structure oxide has a crystal structure where layers 11 corresponding to $[Bi_2O_2]^{2+}$ and layers 12 corresponding to $[MeR_2O_7]^{2-}$ are laminated alternately. FIG. 1 shows the crystal structure of a complete crystal having the stoichiometric composition. Although the layer crystal structure oxide of this embodiment is not illustrated, it has a defect in a part of the crystal structure shown in FIG. 1.

The layer crystal structure oxide has a characteristic where the a axis and the b axis have different lattice constants, and the c axis plane has a ferroelectivity. That is, it has a hysteresis in the voltage-polarization characteristic. In particular, the layer crystal structure oxide shows a good ferroelectivity with a low resistance electric field compared with a layer crystal structure oxide having a smaller composition ratio of the bismuth with respect to the second element or a stoichiometric composition ratio.

As can be analogized from the crystal structure shown in FIG. 1, the layer crystal structure oxide has an anistropic c axis cleavage property (see H. Maeda, Y. Tanaka, M. Fukutomi and T. Asano, Jpn. J. Appl. Phys., 27 (1988) L209.; K. Hiraga, M. Hirabayashi, M. Kikuchi and Y. Syono, Jpn. J. Appl. Phys., 27 (1988) L573).

The fact that the layer crystal structure oxide according to this embodiment has a lower resistance electric field with respect to a layer crystal structure oxide having another composition ratio will be described based on specific experiment results.

Herein an experiment was conducted with a layer crystal structure oxide (BiSTa) comprising bismuth, strontium (first element Me), tantalum (second element R) and oxygen, represented by the stoichiometric composition shown in the chemical formula 2:

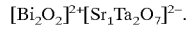
$[Bi_2O_2]^{2+}[Sr_1Ta_2O_7]^{2-}$.

The layer crystal structure oxide was produced by two methods (gas phase method and self flux method) for comparison. In either case, powders of bismuth oxide, strontium carbonate ($SrCO_3$), tantalum oxide ($Ta_2O_5$) (special grade reagents produced by Kojundo Kagaku Kenkyujo). The molar ratio of 79.0 or bismuth oxide, 10.5 of strontium carbonate, and 10.5 of tantalum oxide were mixed. That is, the bismuth oxide was used as the flux.

In the gas phase method, the materials were placed in a platinum crucible stored in an alumina crucible. The alumina crucible closed with a lid was heated by a heating furnace for evaporation. The heating treatment included a first heating step at 1350° C. for 20 hours and a second heating step at 1200° C. for 850 hours. Herein, the upper side wall of the platinum crucible was used as the precipitating part for precipitating a crystal from the gas phase. Accordingly, a plurality of crystals were precipitated on the upper side wall of the platinum crucible. The production method by the gas phase method will be described later in detail.

On the other hand, in the self flux method, the materials were placed in a platinum crucible stored in an alumina crucible. The alumina crucible closed with a lid was heated by a heating furnace so that a crystal was grown in the platinum crucible from the liquid phase. The heating treatment included heating to 1400° C. at a temperature raising rate of 100° C./hour, maintaining at 1400° C. for 2 hours, gradually cooling to 1200 at a temperature lowering rate of 5° C./hour, and cooling in the furnace to the room temperature. Accordingly, a plurality of crystals were grown in the platinum crucible.

The crystals accordingly obtained (gas phase method K1 to K3, self flux method S1 to S6) were observed by (1) identification analysis by the X-ray diffraction, (2) surface observation by a scanning electron microscope (SEM), (3) observation by a polarizing microscope in the crossed nicols state for judging whether or not it is an orthorhombic system, (4) a chemical composition analysis by the EPMA, and (5) observation of the ferroelectric hysteresis. For the EPMA in the item (4), CAMEBAXSX-50 was used for analyzing the wavelength dispersive X-ray spectroscopy (WDS). Results are shown below.

(1) Analysis result by the X-ray diffraction

Figure 2:
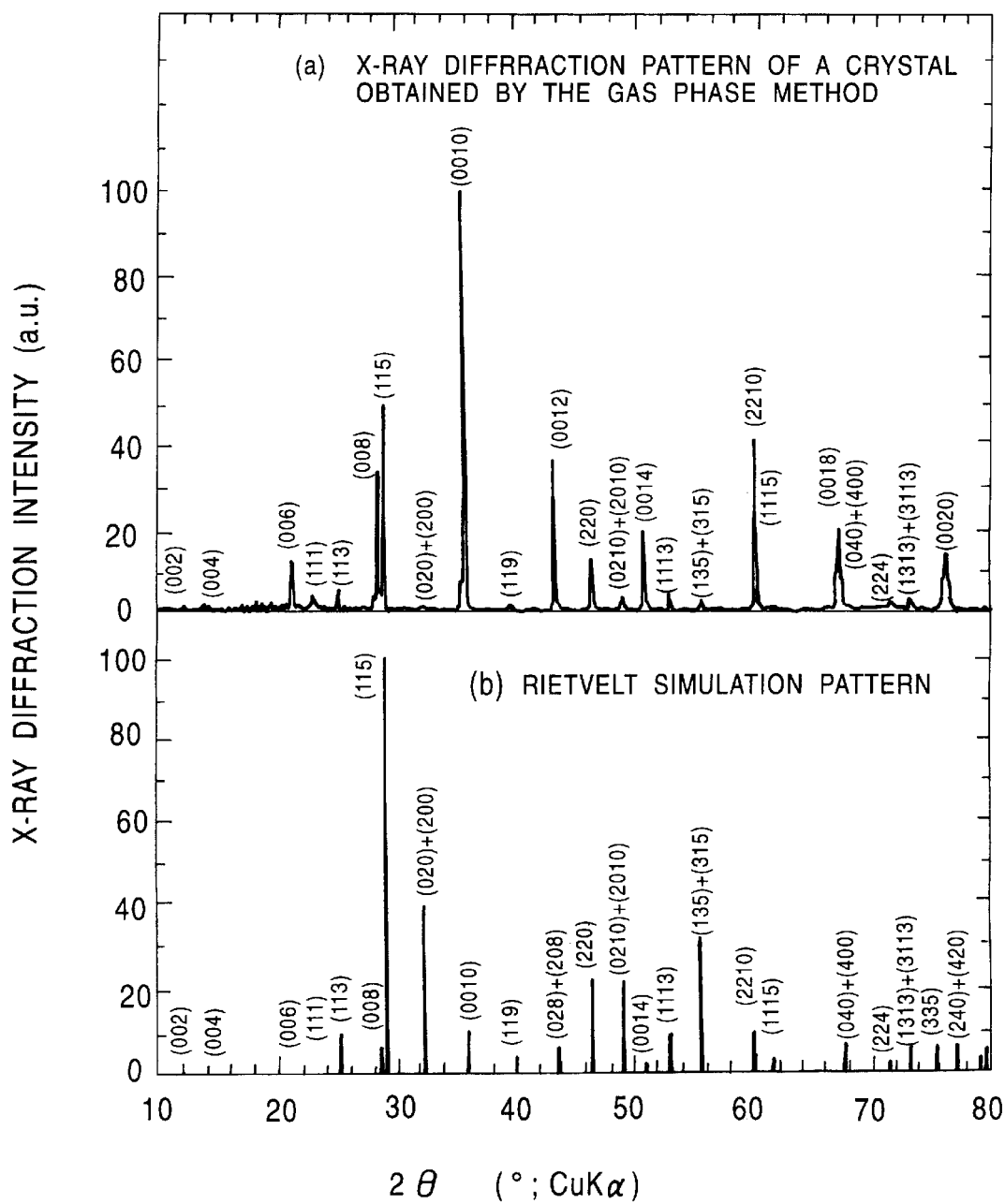
FIG. 2A is an X-ray diffraction pattern showing the composition of the obtained layer crystal structure oxide K1.
FIG. 2B is a Rietvelt simulation pattern thereof.
Figure 3:
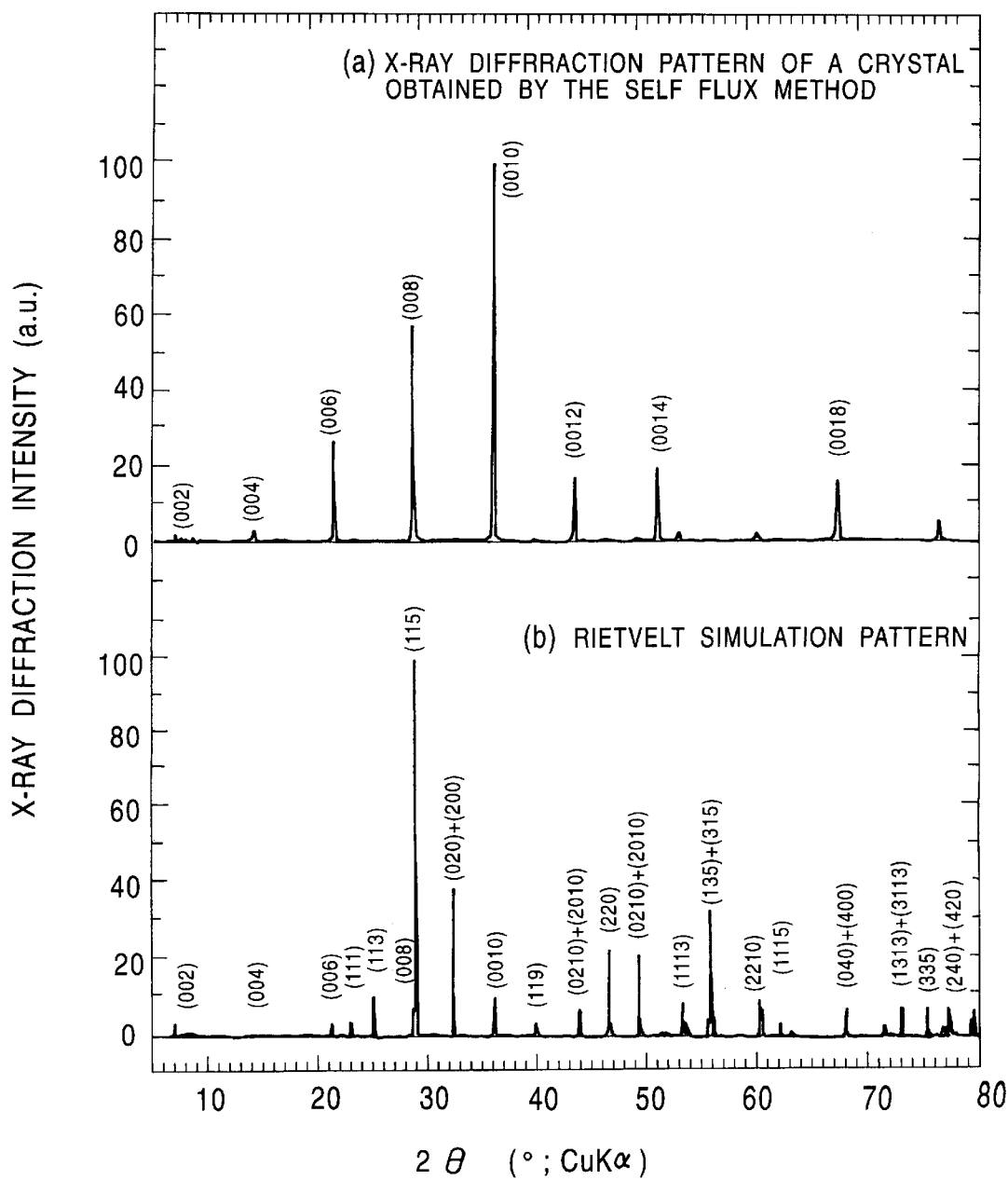
FIG. 3A is an X-ray diffraction pattern showing the composition of the obtained layer crystal structure oxide S1.
FIG. 3B is a Rietvelt simulation pattern thereof.

As the representative of the crystals K1 to K3, the X-ray diffraction pattern (XRDP) of the crystal K1 is shown in FIG. 2. As the representative of the crystals S1 to S6, the XRDP of the crystal S1 is shown in FIG. 3. Although the crystals (K2, K3, S2 to S6) are not illustrated herein, similar XRDP were obtained for them. In FIGS. 2 and 3, the Rietvelt simulation pattern B is shown in addition to the obtained XRDP A. The Rietvelt simulation pattern is the BiSTa standard pattern for comparing the obtained XRDP, which was sought from the Rietvelt simulation based on the lattice constant of Rae et al. (a=0.553065 nm, b=0.553445 nm, c=2.49839 nm; A. D. Rae, J. G. Thompson and R. L. Witers, Acta. Cryst., B48 (1992) 418). In the Rietvelt simulation, "$F_{mmm}$", more symmetrical than "$A2_{1am}$" proposed by Rae et al. was used for the space group.

As shown in FIGS. 2 and 3, the diffraction peak of the obtained XRDP A was identical to the diffraction peak of the Rietvelt simulation pattern B in each crystal (K1 to K3, S1 to S6), and thus it was confirmed that all of the obtained crystals were BiSTa. Since the diffraction peaks (006), (0010) of the obtained XRDP A are larger than the Rietvelt simulation patterns B, it was learned that the obtained crystals have a strong c axis orientation derived from their thin shape.

(2) Result of the surface observation with the SEM.

From the surface observation of the thin piece with the SEM, it was learned that all of the crystals (K1 to K3, S1 to S6) have a smooth surface. As apparent from the (1) X-ray diffraction result and the crystal structure shown in FIG. 1, since the BiSTa has a c axis cleavage property, the smooth surface can be considered as the c plane.

(3) Result of the observation with the polarizing microscope with the cross nicols state.

The obtained crystals were placed on a rotating stage between a pair of polarizers provided in the cross nicols state so as to examine the brightness synchronous to the stage rotation in the c plane. In all of the crystals (K1 to K3, S1 to S6), a cyclic brightness reaction was observed. That is, the lattice constants of the a axis and the b axis of the obtained crystals were not equal. Therefore, from the crystal structure of the BiSTa, the crystal systems thereof were found to be the orthorhombic system.

(4) Result of the chemical composition analysis by the EPMA.

Table 1 shows analysis results of the crystals K1 to K3, and Table 2 shows analysis results of the crystals S1 to S6.

TABLE 1

|  | Bi:Sr:Ta (stoichiometric composition ratio: 2:1:2) | Composition ratio of Bi with respect to Sr (stoichiometric composition ratio: 2) |
| --- | --- | --- |
| Crystal K1 | 2.07:1.10:2.00 | 1.88 |
| Crystal K2 | 2.10:1.04:2.00 | 2.02 |
| Crystal K3 | 2.08:1.01:2.00 | 2.06 |

TABLE 2

|  | Bi:Sr:Ta (stoichiometric composition ratio: 2:1:2) | Composition ratio of Bi with respect to Sr (stoichiometric composition ratio: 2) |
| --- | --- | --- |
| Crystal S1 | 1.92:1.28:2.00 | 1.50 |
| Crystal S2 | 1.96:1.26:2.00 | 1.55 |
| Crystal S3 | 1.85:1.32:2.00 | 1.40 |
| Crystal S4 | 1.84:1.31:2.00 | 1.40 |
| Crystal S5 | 1.88:1.32:2.00 | 1.42 |
| Crystal S6 | 1.88:1.35:2.00 | 1.39 |

As shown in Table 1, in the crystals K1 to K3, by the calculation with the tantalum composition ratio as the stoichiometric ratio of 2, the bismuth was more than the stoichiometric ratio of 2 in any case. That is, the composition ratio of the bismuth with respect to the tantalum was more than the stoichiometric ratio of 1 in any case. Further, the composition ratio of the bismuth with respect to the strontium was in a certain range in the vicinity of the stoichiometric composition ratio of 2.

On the other hand, as shown in Table 2, in the crystals S1 to S6, by the calculation with the tantalum composition ratio as the stoichiometric ratio of 2, the bismuth was less than the stoichiometric ratio of 2 in any case. That is, the composition ratio of the bismuth with respect to the tantalum was less than the stoichiometric ratio of 1 in any case. Further, the composition ratio of the bismuth with respect to the strontium was not in a certain range in the vicinity of the stoichiometric composition ratio of 2, but in the vicinity of 1.4 to 1.5.

(5) Observation result of the ferroelectric hysteresis

Figure 4:
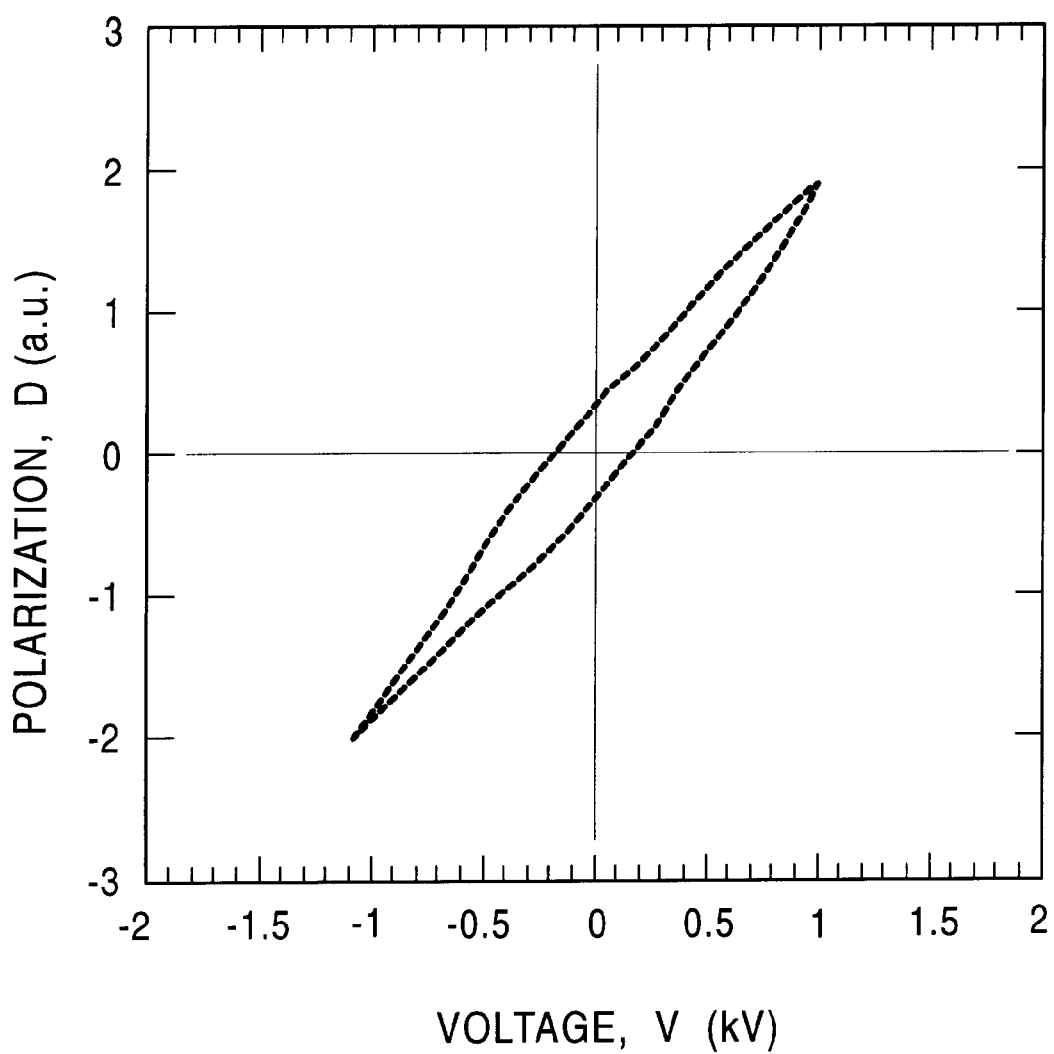
FIG. 4 is a characteristic graph showing the ferroelectric hysteresis loop of the obtained layer crystal structure oxides K1 to K3.
Figure 5:
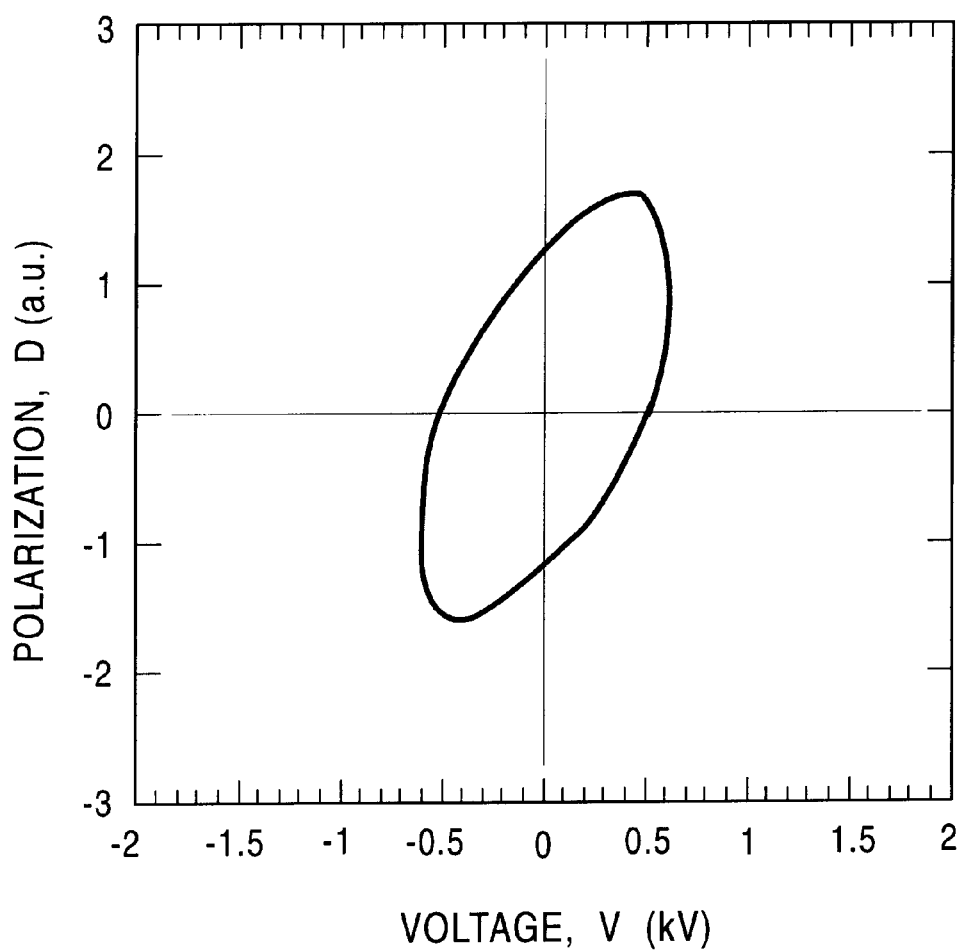
FIG. 5 is a characteristic graph showing the ferroelectric hysteresis loop of the obtained layer crystal structure oxides S1 to S6.

With gold (Au) electrodes deposited on one side of the obtained crystal piece with 500 μm intervals, the ferroelectric hysteresis was observed by applying a 10000 V voltage at 200° C. As a result, the ferroelectric hysteresis loop as shown in FIG. 4 was observed in the crystals K1 to K3. On the other hand, a ferroelectric hysteresis loop was not observed in any of the crystals S1 to S6. With platinum (Pt) electrodes deposited on the crystals S1 to S6 with 100 μm intervals, the ferroelectric hysteresis was observed by applying a 5000 V voltage at 200° C. As a result, the ferroelectric hysteresis loop as shown in FIG. 5 was observed in any case. By the comparison of the hysteresis loops, it was learned that the crystals K1 to K3 have a lower resistance electric field.

Figure 6:
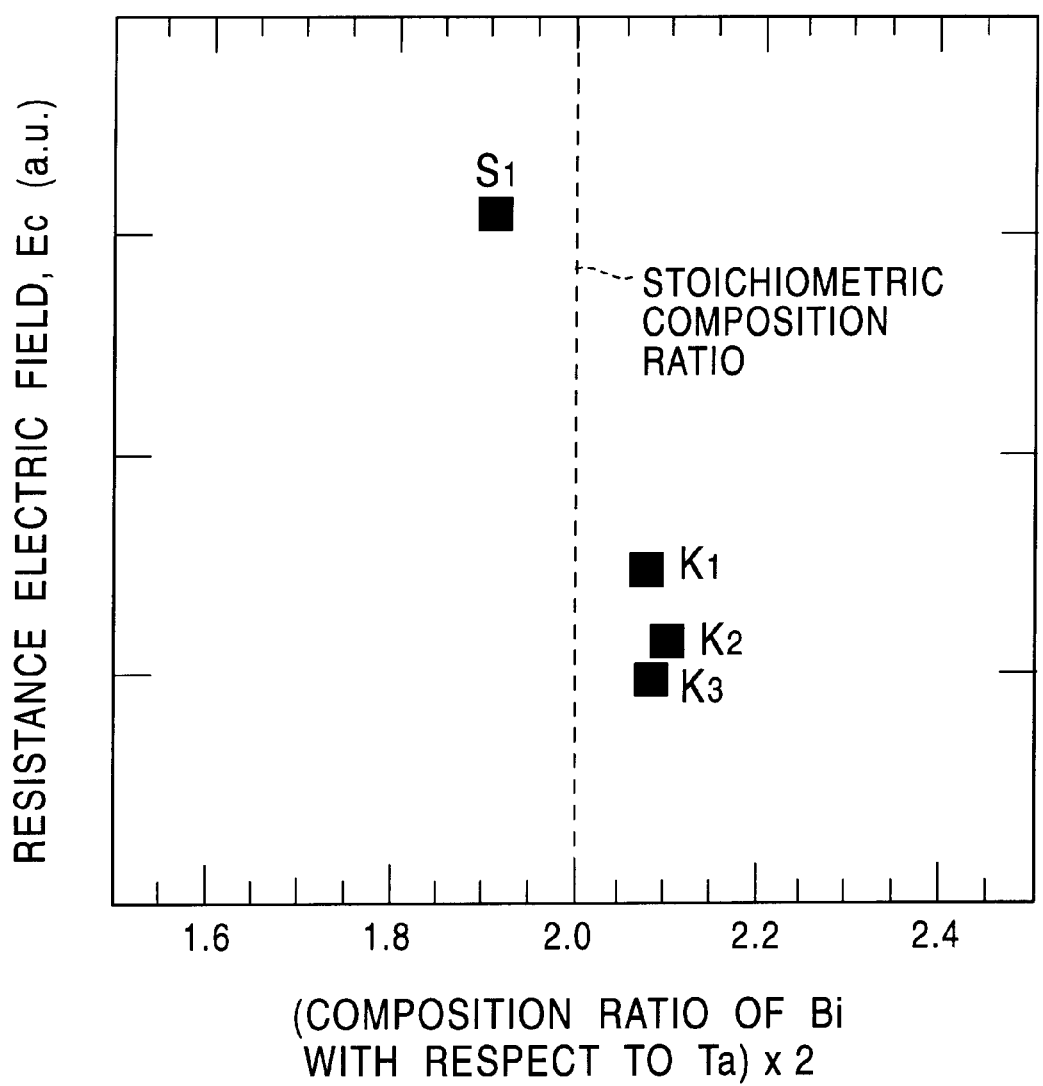
FIG. 6 is a characteristic graph showing the relationship between the bismuth composition with respect to tantalum and the resistance electric field.
Figure 7:
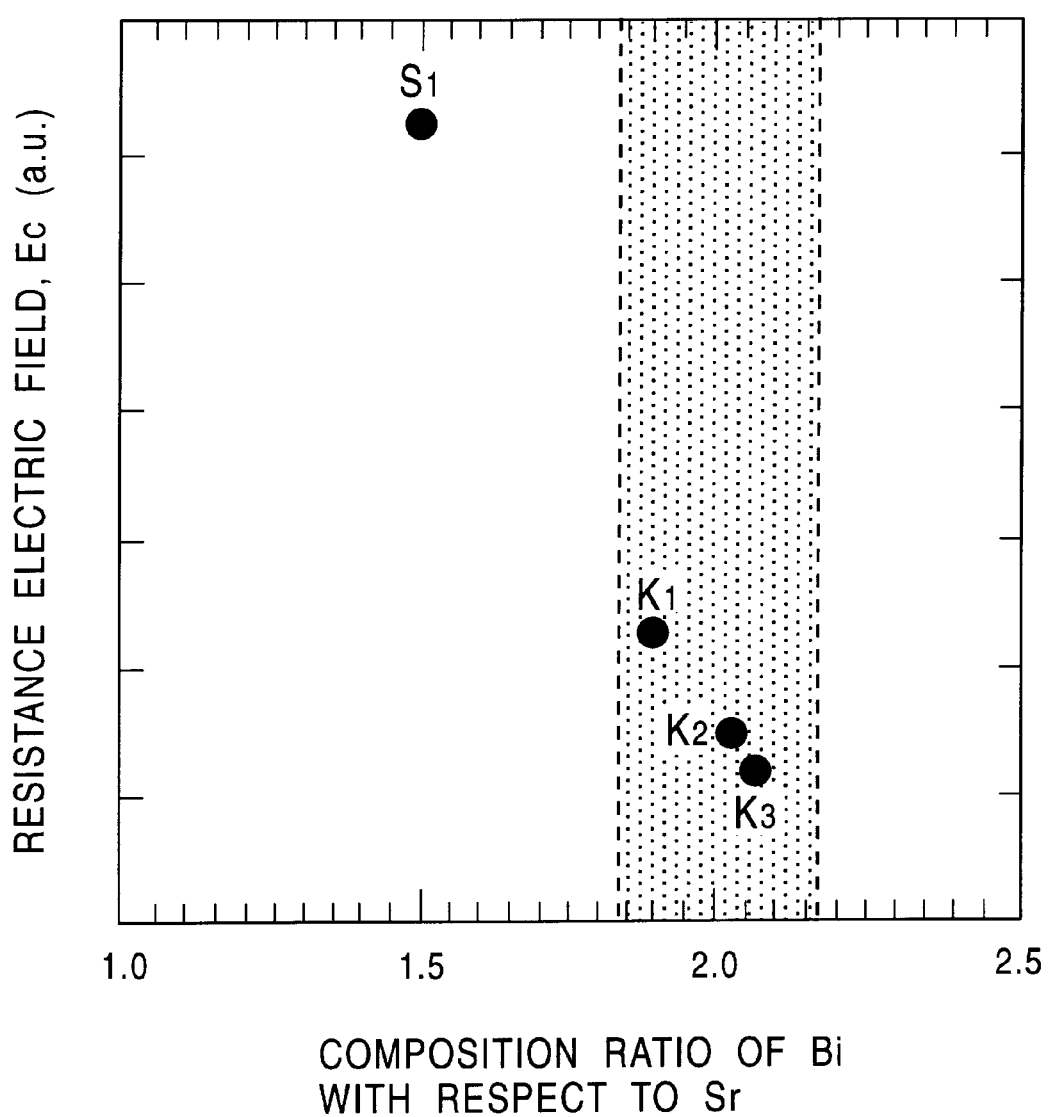
FIG. 7 is a characteristic graph showing the relationship between the bismuth composition with respect to strontium and the resistance electric field.

Based on the results of (4) the chemical composition analysis and the ferroelectric hysteresis observations, the relationship between the resistance electric field and the composition was examined. FIG. 6 shows the relationship between the composition ratio of the bismuth with respect to the tantalum and the resistance electric field. FIG. 7 shows the relationship between the composition ratio of the bismuth with respect to the strontium and the resistance electric field. The crystals K1 to K3 and S1 are shown in FIGS. 6 and 7.

As a result, as shown in FIG. 6, when the composition ratio of the bismuth with respect to the tantalum was larger than the stoichiometric composition ratio, the resistance electric field was lower. As shown in FIG. 7, when the composition ratio of the bismuth with respect to the strontium is in a certain range in the vicinity of the stoichiometric composition ratio, the resistance electric field is lower. When the composition ratio of the bismuth with respect to the strontium is larger, the electric field is higher. In FIG. 6, the position of the stoichiometric composition ratio of the bismuth with respect to the tantalum is shown with the broken line. In FIG. 7, a certain range in the vicinity of the stoichiometric composition ratio of the bismuth with respect to the strontium (2±0.17) is shown by the hatching.

From the above-mentioned experiment results, it was learned that the resistance electric field is lower when the composition ratio of the bismuth with respect to the tantalum is larger than the stoichiometric composition ratio. Further, it was also learned that the resistance electric field is lower when the composition ratio of the bismuth with respect to the strontium is in a certain range in the vicinity of the stoichiometric composition ratio (2±0.17).

The electric characteristic difference was caused by the slight composition ratio, but not by the production method difference. Therefore, in a layer crystal structure oxide produced by another production method can have the same electric characteristic as long as it has the composition the same as this embodiment.

According to the layer crystal structure oxide of this embodiment, since the composition ratio of the bismuth with respect to the second element R $(2+a)/m$ is larger than the stoichiometric ratio $2/m$, a good ferroelectivity can be obtained with a low resistance electric field. Therefore, by forming a ferroelectric nonvolatile memory element therewith, the element can function with a low voltage so that the quality can be improved.

The production method of a layer crystal structure oxide according to the gas phase method will be explained in detail.

In this embodiment, bismuth oxide ($Bi_2O_3$), strontium carbonate ($SrCO_3$), and tantalum oxide ($Ta_2O_5$) were used as the oxide materials. The molar ratio of 30 to 80 of bismuth oxide, 10 to 30 of strontium carbonate, and 10 to 30 of tantalum oxide were mixed. More preferably, the molar ratio is 46.6 to 79.0 of bismuth oxide, 10.5 to 14.3 of strontium carbonate, and 10.5 to 14.3 of tantalum oxide. Particularly preferably, the molar ratio is 79.0 of bismuth oxide, 10.5 of strontium carbonate, and 10.5 of tantalum oxide.

Since the bismuth oxide was used as the flux, the molar ratio of the bismuth oxide is higher. Accordingly, when a layer crystal structure oxide containing bismuth is to be produced, it is preferable to use bismuth oxide as the flux.

Then, the materials added with the bismuth oxide as the flux were placed in an appropriate crucible. The crucible was heated by a heating furnace for evaporating the materials. From the gas phase, a crystal was precipitated at a precipitating part in the furnace.

Figure 8:
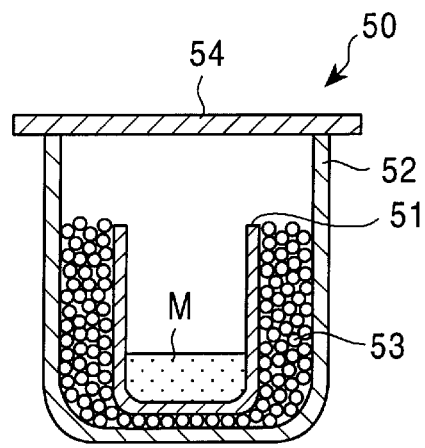
FIG. 8 is a configuration diagram of an embodiment of a crucible to be used in a production method of a layer crystal structure oxide according to one embodiment of the present invention.

FIG. 8 shows one configuration of a crucible for placing materials. The crucible 50 comprises a platinum crucible 51 for placing the material M, an alumina crucible 52 for storing the platinum crucible 51. A plurality of alumina balls 53 are filled between the platinum crucible 51 and the alumina crucible 52 for improving the heat maintaining property. The alumina crucible 52 can be closed with an alumina lid 54.

Figure 9:
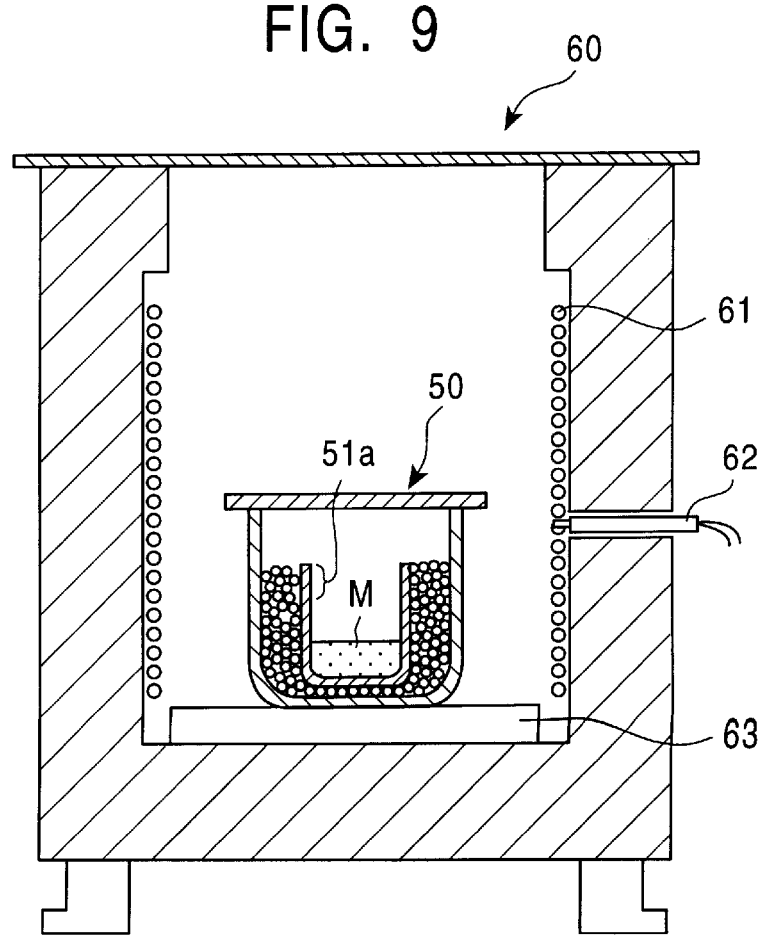
FIG. 9 is a configuration diagram of an embodiment of a heating furnace to be used in a production method of a layer crystal structure oxide according to one embodiment of the present invention.
Figure 10:
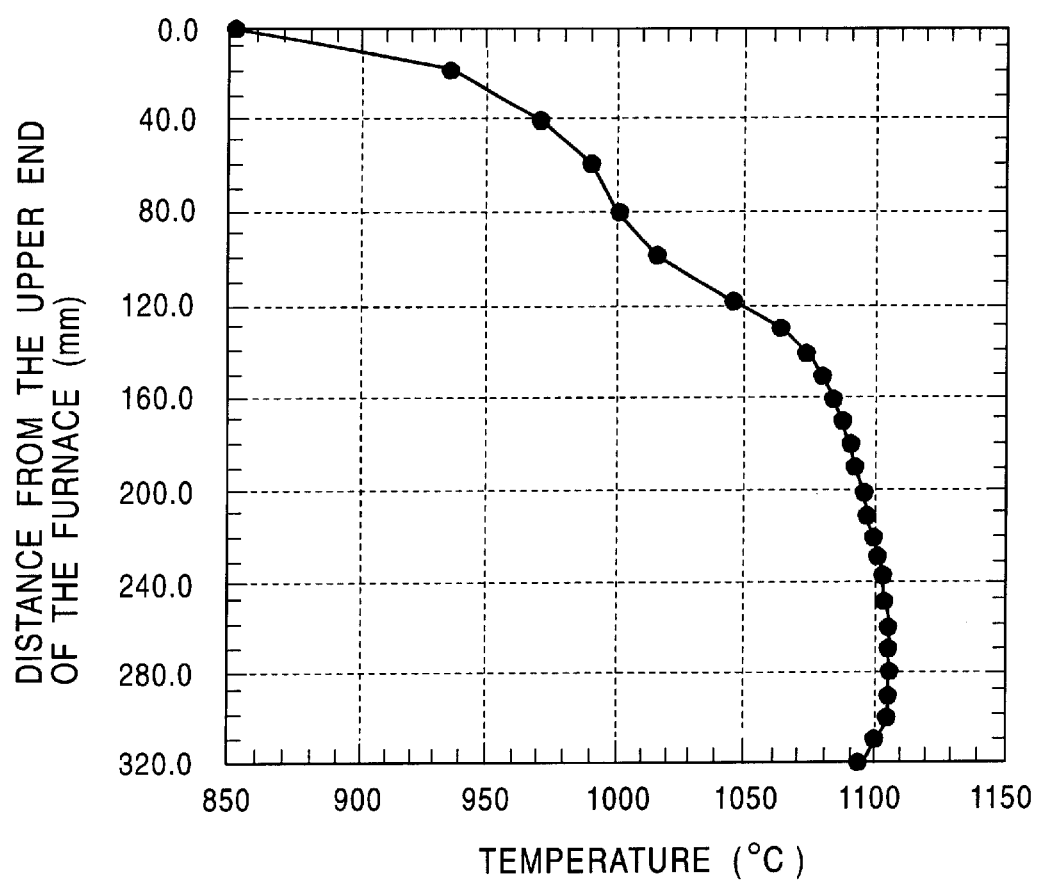
FIG. 10 is a characteristic graph showing the temperature distribution in the heating furnace.

FIG. 9 shows one configuration of a heating furnace for heating the material M. The heating furnace 60 is provided with a kanthal heater 61 along the inner wall so that the inside of the furnace can have a certain temperature gradient in the vertical direction at the time of temperature rise (for example, the temperature distribution shown in FIG. 10). The temperature in the furnace can be controlled by detecting the temperature at a certain position in the furnace by a thermocouple 62 provided on the furnace wall, and comparing the temperature with an inside furnace vertical temperature distribution preliminarily measured. FIG. 10 shows the inside furnace vertical temperature distribution with the temperature detected by the thermocouple 62 of 1100° C.

Further, a precipitating part is provided inside the heating furnace 60 for precipitating crystals. In the example shown in FIG. 9, the upper side wall 51a of the platinum crucible 51 serves as the precipitating part. Although it is now illustrated herein, a substrate comprising a seed crystal of BiSTa or a single crystal of $SrTiO_3$ can be placed above the material M as the precipitating part. That is, the precipitating part can be optionally selected according to the shape of a crystal to be precipitated.

It is preferable that the temperature of the precipitating part is lower than the temperature of heating the material M by 5 to 20° C. A relative position of the precipitating part with respect to the material M can be determined according to the inside furnace temperature distribution. Since impurities can be easily introduced into the crystal if the precipitating part is positioned far away from the material M, it is preferable that the precipitating part is away from the material M by 10 mm to 30 mm. The crucible 50 is provide with a mounting table 63 to be placed so that the crucible 50 position can be adjusted in the furnace according to the inside furnace vertical temperature distribution.

Figure 11:
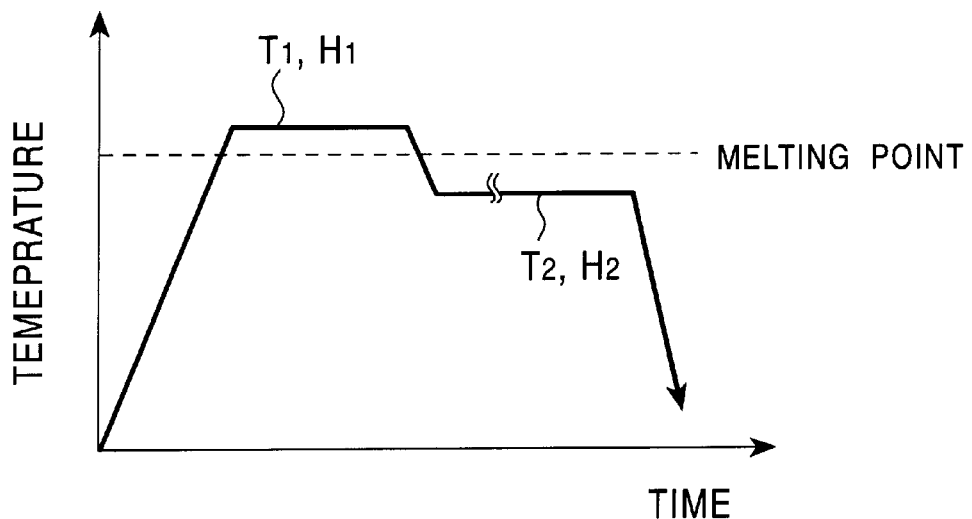
FIG. 11 is a graph showing the heating condition of the material in a production method of a layer crystal structure oxide according to one embodiment of the present invention.
Figure 12:
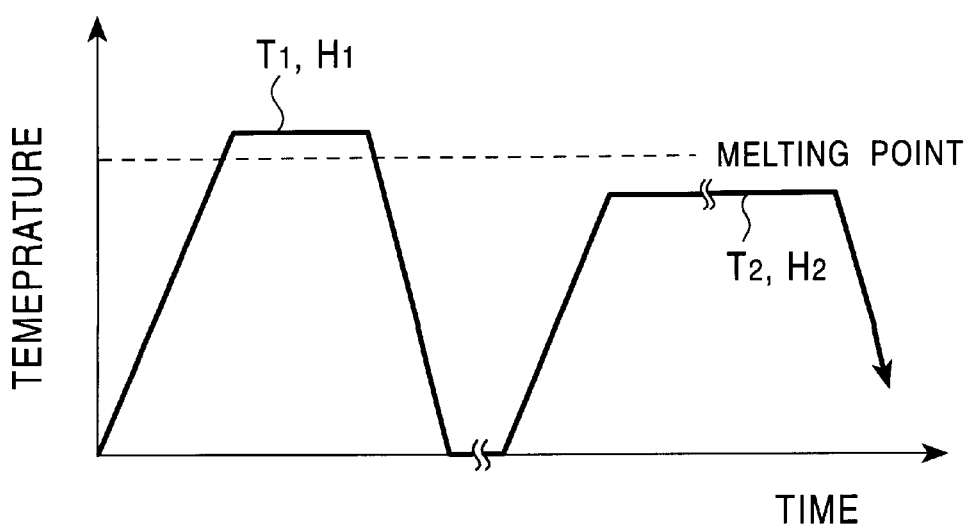
FIG. 12 is a graph showing the heating condition of the material in a production method of a layer crystal structure oxide according to one embodiment of the present invention.

FIG. 11 shows the heating condition for heating the material M. In this embodiment, the material M is heated at a temperature $T_1$ not lower than the melting point (for example, from 1350° C. to 150020 C., preferably 1400° C. to 1500° C.) for a predetermined time $H_1$ (for example, 1 hour or more) so as to completely melt the material M (first heating step). Then, the material M is heated at a temperature $T_2$ lower than the melting point (for example, from 1000° C. to 1300° C., preferably 1150° C. to 1250° C.) for a predetermined time $H_2$ (for example, 100 hours or more) so as to evaporate the molten material M (second heating step).

The reason why the material M heated at the temperature $T_1$ not lower than the melting point in the first heating step is heated at the temperature $T_2$ lower than the melting point in the second heating step is that by continuing to heat at a temperature not lower than the melting point, the evaporation amount of the material M is too large so as to hinder the crystal precipitation. The melting point herein refers to the melting point of the mixture of the material M and the flux. Therefore, the temperature $T_1$ in the first heating step is higher than the melting point 1330° C. of the material M with bismuth oxide as the flux, and the temperature $T_2$ in the second heating step is lower than the melting point of the material M.

The material M can be heated continuously with the first heating step followed b the second heating step as shown in FIG. 11, or can be heated with a cooling interval between the first heating step and the second heating step.

By the operation, a large crystal of a layer crystal structure oxide can be precipitated at a precipitating part (such as the upper side wall 51C of the platinum crucible 51). According to the production method, a layer crystal structure oxide having the composition ratio of the bismuth with respect to the tantalum slightly larger than the stoichiometric composition ratio, and the composition ratio of the bismuth with respect to the strontium of 2±0.17 can be obtained. The layer crystal structure oxide shows a good ferroelectivity in the c plane with a low resistance electric field.

According to the production method of a layer crystal structure oxide of this embodiment, since a crystal is precipitated at a precipitating part from a gas phase obtained by heating and evaporating the mixed material M, a large crystal of a layer crystal structure oxide can be obtained easily. Therefore, a layer crystal structure oxide can be put into practice as a material of the FeRAM or a material of the optical element.

Furthermore, by optionally selecting a seed crystal or a substrate for the precipitating part, crystals having various kinds of shapes can be obtained according to various kinds of applications. Therefore, the layer crystal structure oxide can be adopted easily in various kinds of applications.

Concrete configurations will be provided hereinafter.

As mentioned above, in this embodiment, powders of bismuth oxide, strontium carbonate, tantalum oxide were prepared and the molar ratio of 79.0 or bismuth oxide, 10.5 of strontium carbonate, and 10.5 of tantalum were mixed. The bismuth oxide was used as the flux.

The crucible 50 shown in FIG. 8 was prepared. 40 g of the mixed material M was placed in the inside platinum crucible 51, and the outside alumina crucible 52 was closed with the lid 54. The platinum crucible 51 has a 50 cc capacity. The crucible 50 was placed in the heating furnace 60 shown in FIG. 9 so as to heat the material M for completely melting at 1350° C. for 20 hours (first heating step) and heat at 1200° C. for 850 hours (second heating step).

Crystals were precipitated on the upper side wall 51c of the platinum crucible 51 away from the material M by about 30 mm. The temperature at the position where the crystals were precipitated at the time of the precipitation (the temperature at the position away from the material M by 30 mm) was lower than the temperature for heating the material M by about 10° C. according to the inside furnace temperature distribution preliminarily measured (see FIG. 10). The obtained crystals were substantially colorless and transparent with various shapes such as a sword-like shape and a plate-like shape. Concerning the crystal size, the maximum sword-like crystal has about 12 mm×2.2 mm×20 $\mu$m, the maximum plate-like crystal has about 5.6 mm×5.3 mm×20 $\mu$m. A pure single crystal of BiSTa is colorless and transparent. Further, Laue spots were observed. Therefor, it was learned that the obtained crystals are single crystals.

Although a layer crystal structure oxide was produced by heating the material M at 1350° C. for 20 hours (first heating step) and heating at 1200° C. for 850 hours (second heating step) in the above-mentioned first embodiment, a layer crystal structure oxide can be produced similarly by heating the material M at a temperature from 1000° C. to 1300° C. and for an optional time as the first heating step and heating for an optional time as the second heating step so as to obtain similar crystals. As in the first embodiment, the first heating step and the second heating step can be conducted successively or with an interval therebetween.

(Second embodiment)

Figure 13:
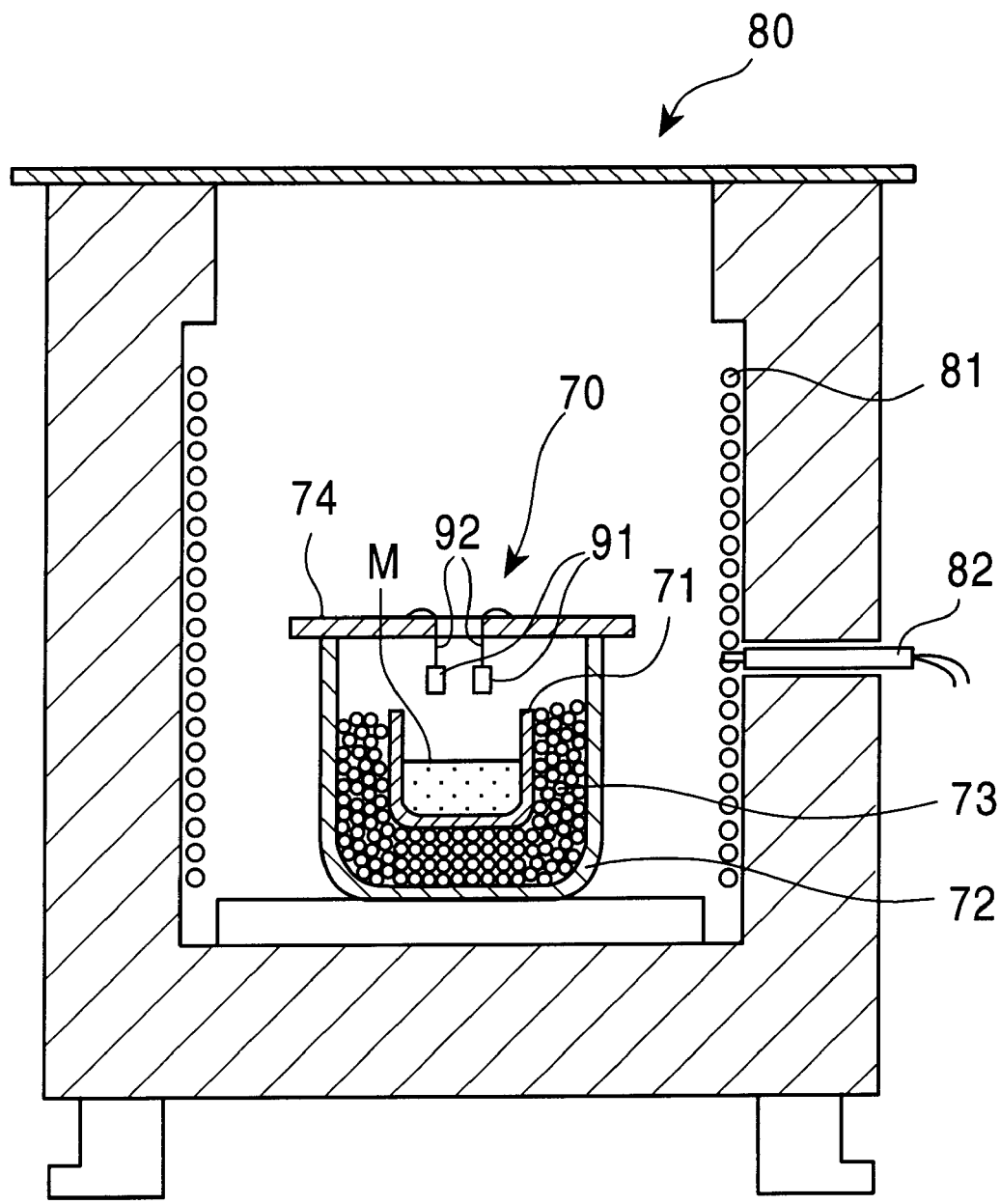
FIG. 13 is a configuration diagram of an embodiment of a crucible and a heating furnace to be used in a production method of a layer crystal structure oxide according to the second embodiment of the present invention.

In this embodiment, the material M the same as the first embodiment was prepared, and the material M was mixed with the composition ratio the same as the first embodiment. With a crucible 70 and a heating furnace 80 shown in FIG. 13, 40 g of the material M was heated. The crucible 70 used herein comprises a platinum crucible 71 placed in an alumina crucible 72 with alumina balls 73 provided therebetween as the crucible 50 shown in FIG. 8. The alumina crucible 72 is closed with a lid 74. The platinum crucible 71 has a 50 cc capacity. A heating furnace 80 can be heated by a kanthal heater 81 so as to have a certain temperature gradient in the vertical direction at the time of temperature rise as the heating furnace 60 shown in FIG. 9. The temperature in the furnace can be controlled by a thermocouple 82 provided on the furnace wall.

In the first embodiment, the upper side wall 51c of the platinum crucible 51 served as the precipitating part, whereas a seed crystal 91 was provided above the platinum crucible 71 to be the precipitating part in this embodiment. A single BiSTa crystal obtained in the first embodiment used as the seed crystal 91 was hanged from the lid 74 f the crucible 70 with a platinum wire 92. The seed crystal 91 and the platinum wire 92 were fixed with an inorganic adhesive (such as Aron Ceramics produced by Toa Kagaku). The distance between the seed crystal 91 and the material M was set at 2 to 5 cm so that the temperature of the seed crystal 91 can be lower than the temperature for heating the material M by about 10° C.

The material M was heated for completely melting at 1400° C. for 20 hours (first heating step) and successively heated at 1200° C. for 850 hours (second heating step). Accordingly, crystals were precipitated on the surface of the seed crystal 91. The crystals were analyzed as in the first embodiment, and it was found out that they are similar to the crystals obtained in the first embodiment.

Although a layer crystal structure oxide was produced by heating the material M at 1400° C. for 20 hours (first heating step) and heating at 1200° C. for 850 hours (second heating step) in the above-mentioned second embodiment, a layer crystal structure oxide can be produced similarly by heating the material M at a temperature from 1350° C. to 1500° C. for an optional time and heating at a temperature from 1000° C. to 1300° C. for an optional time so as to obtain similar crystals. Although the seed crystal 91 was placed in a position at a temperature lower than the temperature for heating the material M by about 10° C. in the above-mentioned second embodiment, a layer crystal structure oxide can be produced similarly by placing the seed crystal 91 in a position at a temperature lower than the temperature for heating the material M by 5° C. to 20° C. so as to obtain similar crystals. As in the second embodiment, the first heating step and the second heating step can be conducted successively or with an interval therebetween.

(Third embodiment)

Figure 14:
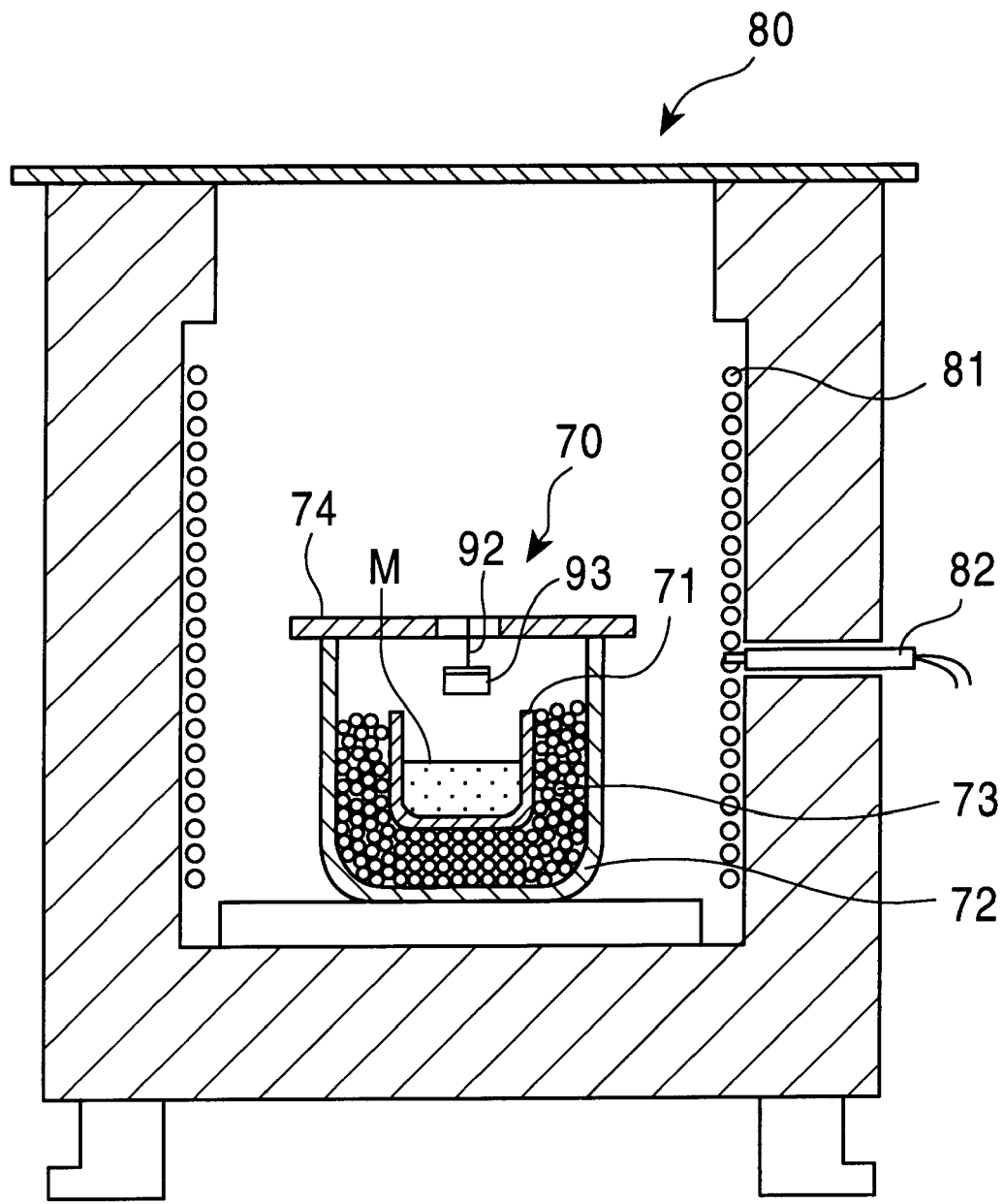
FIG. 14 is a configuration diagram of an embodiment of a crucible and a heating furnace to be used in a production method of a layer crystal structure oxide according to the third embodiment of the present invention.

In this embodiment, the material M the same as the first embodiment was prepared, and the material M was mixed with the composition ratio the same as the first embodiment. With the crucible 70 and the heating furnace 80 the same as the second embodiment, 40 g of the material M was heated. In the second embodiment, the seed crystal 91 provided above the platinum crucible 71 served as the precipitating part, whereas a substrate 93 was provided above the platinum crucible 71 as shown in FIG. 14 to be the precipitating part in this embodiment. A plate-like $SrTiO_3$ single crystal used as the substrate 93 was hanged from the lid 74 f the crucible 70 with the platinum wire 92. The substrate 93 and the platinum wire 92 were fixed with an inorganic adhesive (such as Aron Ceramics produced by Toa Kagaku). The distance between the substrate 93 and the material M was set at 2 to 5 cm so that the temperature of the seed crystal 91 can be lower than the temperature for heating the material M by about 10° C.

The material M was heated for completely melting at 1400° C. for 20 hours (first heating step) and successively heated at 1200° C. for 850 hours (second heating step) as in the second embodiment. Accordingly, crystals were precipitated on the surface of the substrate 93. The crystals were analyzed as in the first embodiment, and it was found out that they are similar to the crystals obtained in the first embodiment.

Although a layer crystal structure oxide was produced by heating the material M at 1400° C. for 20 hours (first heating step) and heating at 1200° C. for 850 hours (second heating step) in the above-mentioned third embodiment, a layer crystal structure oxide can be produced similarly by heating the material M at a temperature from 1350° C. to 1500° C. for an optional time and heating at a temperature from 1000°

C. to 1300° C. for an optional time so as to obtain similar crystals. Although the substrate 93 was placed in a position at a temperature lower than the temperature for heating the material M by about 10° C. in the above-mentioned third embodiment, a layer crystal structure oxide can be produced similarly by placing the substrate 93 in a position at a temperature lower than the temperature for heating the material M by 5° C. to 20° C. so as to obtain similar crystals. As in the third embodiment, the first heating step and the second heating step can be conducted successively or with an interval therebetween.

From the results of the above-mentioned embodiments, it was learned that by heating a material M containing bismuth oxide as the flux at a temperature of the melting point or higher for melting, heating the same at a temperature lower than the melting point for evaporation, crystals of a layer crystal structure oxide can be precipitated from the gas phase at a precipitating part having a temperature lower than the temperature for heating the material M. It was also learned that by optionally selecting the precipitating part, crystals can be precipitated with various shapes according to the application.

Although the present invention has been explained with reference to embodiments, the present invention is not limited thereto but can be modified in various ways within the range of the following claims. For example, although the cases of producing a layer crystal structure oxide comprising bismuth, strontium, tantalum and oxide have been explained, according to the present invention, other so-called Aurivillius crystallographic group layer crystal structure oxides represented by the chemical formula 1 can be similarly produced.

In particular, the present invention is preferably used in the production of a layer crystal structure oxide represented by the chemical formula 1, wherein m is 2, the first element (Me) is at least one selected from the group consisting of strontium, lead, barium, and calcium, and the second element is at least one selected from the group consisting of niobium, and tantalum.

Specifically speaking for the other ones in the Aurivillius crystallographic group, layer crystal structure oxides represented by the chemical formula 1, where m is 2, such as $Bi_2BiTiNbO_9$ and $Bi_2BiTiTaO_9$, where m is 3, such as $Bi_4Ti_3O_{12}$, where m is 4, such as $Bi_2Bi_2CaTi_4$, $Bi_2Bi_2SrTi_4O_{15}$, $Bi_2Bi_2BaTi_4O_{15}$, $Bi_2Bi_2PbTi_4O_{15}$, $Bi_2Bi_{2.5}Na_{0.5}Ti_4O_{15}$ and $Bi_2Bi_{2.5}K_{0.5}Ti_4O_{15}$, where m is 5, such as $Bi_2Bi_2Sr_2Ti_5O_{18}$, $Bi_2Bi_2Ba_2Ti_5O_{18}$ and $Bi_2Bi_2Pb_2Ti_5O_{18}$ can be produced similarly.

In producing a layer crystal structure oxide other than BiSTa, materials can be selected optionally from bismuth oxide, strontium carbonate, tantalum oxide, sodium carbonate ($Na_2CO_3$), potassium carbonate ($K_2CO_3$), calcium carbonate ($CaCO_3$), barium carbonate ($BaCO_3$), lead monoxide (PbO), diiron trioxide ($Fe_2O_3$), titanium oxide ($TiO_2$), niobium oxide ($Nb_2O_5$), tungsten oxide ($WO_3$), and the like according to the composition.

Moreover, according to the present invention, not only the so-called Aurivillius crystallographic group, but also layer crystal structure oxides represented by the chemical formula 3, known as superconductive materials can be produced similarly. They are called Bi type superconductive layer oxides, having a crystal structure similar to the Aurivillius crystallographic group. In particular, they are particularly alike since the layers are divided by Bi—O in terms of the anisotropy.

$$Bi_2Sr_2Ca_{n-1}Cu_nO_{2n+4} (n \leq 4)$$

Although only the case of using bismuth oxide as the flux has been explained in the above-mentioned embodiments, the present invention can be applied to the case of using another substance as the flux. However, it is preferable to use a substance comprising the composition of the layer crystal structure oxide as the flux.

Although the case of heating the material M at a temperature of the melting point or higher (first heating step) followed by heating at a temperature lower than the melting point (second heating step) has been explained in the above-mentioned embodiments, the material heating condition can be optionally changed according to the kind of the flux, the composition of the layer crystal structure oxide to be produced, and the like. That is, the present invention includes various cases of producing a layer crystal structure oxide by precipitating a crystal at a precipitating part from a gas phase prepared by heating a mixed material for evaporation.

(Fourth embodiment)

Figure 15:
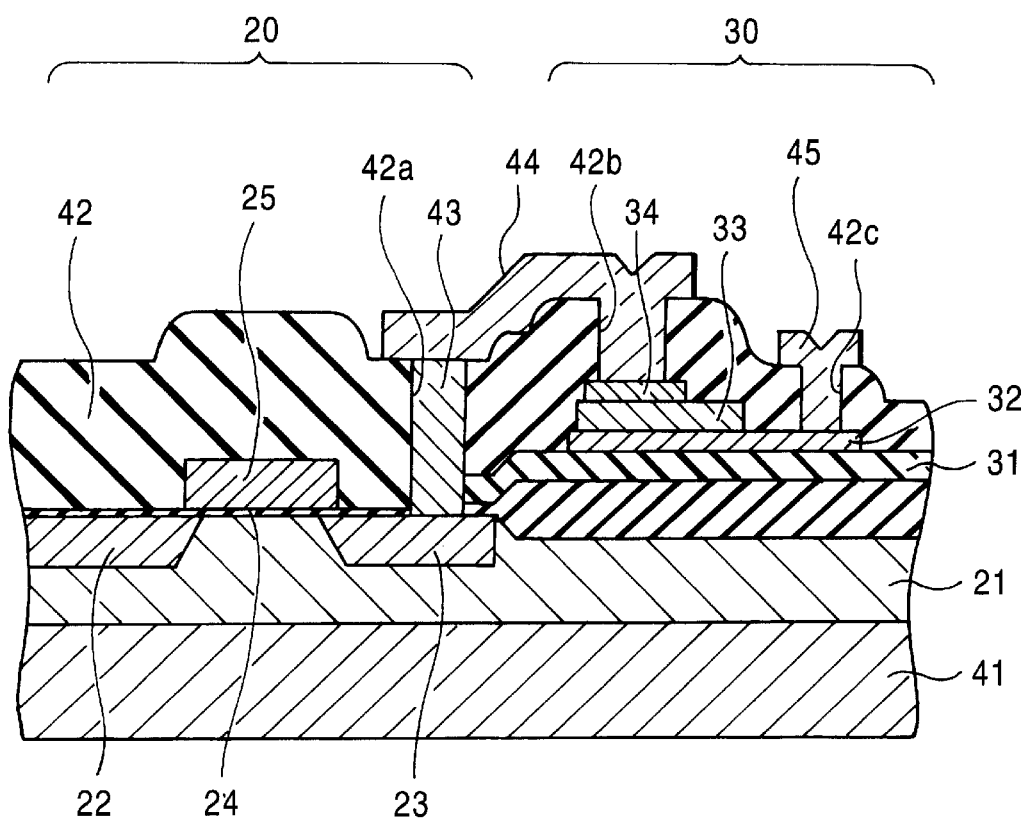
FIG. 15 is a configuration diagram of an embodiment of a memory cell to be used in a production method of a layer crystal structure oxide according to the fourth embodiment of the present invention.

FIG. 15 shows the configuration of a memory cell according to this embodiment. The memory cell comprises a transistor 20 for switching and a memory element 30. The transistor 20 is a so-called MOS (metal-oxide-semiconductor). A P well layer 21 with impurities such as boron (B) injected is formed on a semiconductor substrate (such as an N type silicon (Si) semiconductor substrate) 41. In a source electrode forming region of the P well layer 21, a source electrode 22 comprising an N$^+$ layer with impurities such as phosphorus (P) injected is formed. In a drain electrode forming region, a drain electrode 23 similarly comprising an N$^+$ layer is formed. The source electrode 22 and the drain electrode 23 are formed with an optional interval. A gate electrode 25 is formed on the interval therebetween via a gate insulating film 24 comprising silicon dioxide ($SiO_2$).

The memory element 30 comprises a lower electrode 32 made from an optional metal such as aluminum (Al) via an interlayer insulating film 31 made from silicon dioxide in a memory forming region of the semiconductor substrate 41. A ferroelectric film 33 made of a layer crystal structure oxide of the present invention (such as one made from bismuth, strontium, tantalum, and oxygen, with the composition ratio of the bismuth with respect to the tantalum larger than the stoichiometric ratio) is formed on a part of the lower electrode 32. An upper electrode 34 made from an optional metal such as aluminum is formed on the ferroelectric film 33. That is, a pair of electrodes comprising the lower electrode 32 and the upper electrode 34 is connected to the ferroelectric film 33 of the memory element 30. The ferroelectric film 33 can comprise either a single crystalline layer crystal structure oxide or a polycrystalline layer crystal structure oxide. However, it is preferable to comprise only a layer crystal structure oxide phase without an impurity phase such as a metal bismuth, a bismuth alloy compound, or another oxide.

An interlayer insulating film 42 made from silicon dioxide is formed on the transistor 20 and the memory element 30. The interlayer insulating film 42 is provided with a contact hole 42a for contacting with the drain electrode 23, a contact hole 42b for contacting with the upper electrode 34, and a contact hole 42c for contacting with the lower electrode 32.

A taken-out electrode 43 made from a polycrystalline silicon, and the like is formed on the drain electrode 23 exposed by the contact hole 42a. A wiring 44 made from an optional metal such as aluminum is formed between the upper electrode 34 exposed by the contact hole 42b and the taken-out electrode 43 for electrically connecting the upper electrode 34 and the taken-out electrode 43 (that is, the drain electrode 23). Furthermore, a wiring 45 made from an optional metal such as aluminum is formed on the lower electrode 32 exposed by the contact hole 42c for electrically connecting the lower electrode 32 and other elements (not illustrated).

Although it is not shown in FIG. 15, the interlayer insulating film 42 is provided with contact holes for connecting with the source electrode 22 and the gate electrode 25, respectively. The source electrode 22 and the gate electrode 25 are connected with an optional wiring via each contact hole so that a current can flow between the source electrode 22 and the drain electrode 23 by applying a voltage on the gate electrode 25.

A memory cell having such a configuration can be produced as mentioned below.

The P well layer 21 is formed by injecting an impurity such as boron into the semiconductor substrate 41. The source electrode 22 and the drain electrode 23 comprising an $N^+$ layer are formed by selectively injecting an impurity such as phosphorus in a source electrode forming region and a drain electrode forming region. The gate oxide film 24 is formed by oxidizing the surface of the P well layer 21 where the source electrode 22 and the drain electrode 23 are formed. Then, a polycrystalline silicon film is selectively laminated on a region between the source electrode 22 and the drain electrode 23 by a CVD (chemical vapor deposition) method so as to form a gate electrode 25. Accordingly, the transistor 20 can be formed.

After forming the transistor 20, the interlayer insulating film 31 is formed on the surface. The lower electrode 32 is formed by selectively depositing a metal film made from aluminum in the memory element forming region. The ferroelectric film 33 is formed by selectively laminating a layer crystal structure oxide thin film of the present invention. The layer crystal structure oxide thin film can be laminated by precipitating crystals of the layer crystal structure oxide on the surface of the semiconductor substrate 41 by a gas phase method. The upper electrode 34 is formed by selectively depositing a metal film made from aluminum on the ferroelectric film 33. Accordingly, the memory element 30 can be formed.

After forming the memory element 30, the interlayer insulating film 42 is formed on the memory element 30 and the transistor 20. Then contact holes 42a, 42b, 42c for exposing the surface of a part of the drain electrode 23, the upper electrode 34 and the lower electrode 32, and contact holes (not illustrated) for exposing the surface of a part of the source electrode 22 and the gate electrode 25 are provided. The taken-out electrode 43 is formed by selectively laminating a polycrystalline silicon layer in the contact hole 42a by a CVD method. The wirings 44, 45 are formed by selectively depositing a metal film made from aluminum. Accordingly, the transistor 20 and the memory element 30 can be electrically connected to form the memory cell shown in FIG. 15.

In the memory cell, when a voltage is applied to the gate electrode 25 of the transistor 20, the transistor 20 is switched on so as to flow a current between the source electrode 22 and the drain electrode. Accordingly, a current flows in the memory element 30 via the taken-out electrode 43 and the wiring 44 so as to apply a voltage between the upper electrode 34 and the lower electrode 32. In the memory element 30, the ferroelectric film 33 can be polarized when a voltage is applied thereto. Since the voltage-polarization characteristic has a hysteresis, data of "1" or "0" can be stored or read out using the hysteresis. At the time, since the ferroelectric film 33 comprises a layer crystal structure oxide film of the present invention, the resistance electric field is low so that data can be stored or read out even when the applied pressure is low.

According to a memory cell of this embodiment, since the ferroelectric film comprises a layer crystal structure oxide of the present invention, that is, a ferroelectric substance with a low resistance electric field, the memory cell can operate with a low voltage so that the quality can be improved.

Although the present invention has been explained with reference to embodiments, the present invention is not limited thereto but can be modified in various ways within the range of the following claims. For example, although it was shown in the first embodiment that a layer crystal structure oxide according to the present invention has a lower resistance electric field with respect to ones with another composition with reference to specific experiment examples with BiSTa, the same result can be obtained with a layer crystal structure oxide comprising bismuth, a first element Me, a second element R, and oxygen (the first element Me is at least one selected from the group consisting of sodium, potassium, calcium, barium, strontium, lead and bismuth, the second element R is at least one selected from the group consisting of iron, titanium, niobium, tantalum, and tungsten).

Although a memory cell comprising the transistor 20 and the memory element 30 was explained in the above-mentioned fourth embodiment, the present invention includes all the cases having a memory element comprising a ferroelectric film with a layer crystal structure oxide of the present invention, connected with a pair of electrodes. Therefore, the configuration of the transistor 20 is not limited to the MOS transistor, but can be, for example, an LSI (large scale integrated circuit) memory.

Although the case of using a layer crystal structure oxide of the present invention as the memory element was explained in the above-mentioned fourth embodiment, it is also possible to use it as another capacitor other than the memory element.

As heretofore mentioned, according to a layer crystal structure oxide of the present invention, since the composition ratio of bismuth with respect to a second element is larger than the stoichiometric composition ratio, a good ferroelectivity can be obtained with a low resistance electric field. Therefore, by forming a ferroelectric nonvolatile memory therewith, the memory can function with a low voltage so that the quality can be improved.

According to a production method of a layer crystal structure oxide of the present invention, since crystals are precipitated at a precipitating part from a gas phase obtained by heating a material, a large crystal of a layer crystal structure oxide can be obtained easily. Therefore, an effect of putting a layer crystal structure oxide into practice as a material of an FeRAM or a material of an optical element can be achieved.

Furthermore, according to a memory element of the present invention, since a ferroelectric film comprises a layer crystal structure oxide where the composition ratio of bismuth with respect to a second element is larger than the stoichiometric composition ratio, the element can function at a low voltage so that the quality can be improved.

What is claimed is:

1. A layer crystal structure oxide comprising bismuth (Bi), a first element, a second element and oxygen (O), wherein the first element is at least one selected from the group consisting of sodium (Na), potassium (K), calcium (Ca), barium (Ba), strontium (Sr), lead (Pb), and bismuth (Bi), the second element is at least one selected from the group consisting of iron (Fe), titanium (Ti), niobium (Nb), tantalum (Ta), and tungsten (W), and the composition ratio of the bismuth with respect to the second element is larger than the stoichiometric composition ratio, wherein, the composition ratio of the bismuth with respect to the first element is in the range of $(2\pm0.17)/(m-1)$ where m is 2, 3, 4 or 5.

2. The layer crystal structure oxide of claim 1 wherein the composition ratio is $2/(m-1)$.

3. The layer crystal structure oxide according to claim 1, wherein the first element is strontium and the second element is tantalum.

4. The layer crystal structure oxide according to claim 3, wherein the stoichiometric composition ratio of the bismuth with respect to the tantalum is 1, and the composition ratio of the bismuth with respect to the tantalum is larger than 1 but not larger than 1.08.

5. The layer crystal structure oxide according to claim 1, wherein the first element is strontium and the second element is tantalum.

6. The layer crystal structure oxide according to claim 5, wherein the stoichiometric composition ratio of the bismuth with respect to the strontium is 2, and the composition ratio of the bismuth with respect to the strontium is in the range of 1.88 or more and 2.06 or less.

7. A memory element comprising a pair of electrodes connected with a ferroelectric film comprising a layer crystal structure oxide comprising bismuth (Bi), a first element, a second element and oxygen (O), wherein the first element is at least one selected from the group consisting of sodium (Na), potassium (K), calcium (Ca), barium (Ba), strontium (Sr), lead (Pb), and bismuth (Bi), the second element is at least one selected from the group consisting of iron (Fe), titanium (Ti), niobium (Nb), tantalum (Ta), and tungsten (W), and the composition ratio of the bismuth with respect to the second element is larger than the stoichiometric composition ratio, wherein, the composition ratio of the bismuth with respect to the first element is in the range of $(2\pm0.17)/(m-1)$ where m is 2, 3, 4 or 5.

8. The memory element of claim 7 wherein the composition ratio is $2/(m-1)$.

9. The memory element according to claim 7, wherein the first element in the layer crystal structure oxide is strontium and the second element is tantalum.

10. The memory element according to claim 9, comprising the layer crystal structure oxide having the stoichiometric composition ratio of the bismuth with respect to the tantalum of 1 as the ferroelectric film, wherein the composition ratio of the bismuth with respect to the tantalum is larger than 1 but not larger than 1.08.

11. The memory element according to claim 7, wherein the first element in the layer crystal structure oxide is strontium and the second element is tantalum.

12. The memory element according to claim 11, comprising the layer crystal structure oxide having the stoichiometric composition ratio of the bismuth with respect to the strontium of 2 as the ferroelectric film, wherein the composition ratio of the bismuth with respect to the strontium is in the range of 1.88 or more and 2.06 or less.

13. The memory element according to claim 7, wherein the ferroelectric film comprises only the phase of the layer crystal structure oxide.

* * * * *